United States Patent
Kasten

(10) Patent No.: US 6,313,634 B1
(45) Date of Patent: Nov. 6, 2001

(54) DEVICE AND METHOD TO HOMOGENIZE A MAGNETIC FIELD

(75) Inventor: Arne Kasten, Karlsruhe (DE)

(73) Assignee: Bruker Analytik GmbH, Rheinstetten (DE)

( * ) Notice: Subject to any disclaimer, the term of this patent is extended or adjusted under 35 U.S.C. 154(b) by 0 days.

(21) Appl. No.: 09/472,633

(22) Filed: Dec. 27, 1999

(30) Foreign Application Priority Data

Jan. 15, 1999 (DE) .............................................. 199 01 331

(51) Int. Cl.⁷ ...................................................... G01V 3/00
(52) U.S. Cl. ........................... 324/320; 324/318; 324/309
(58) Field of Search ..................................... 324/320, 309, 324/319, 307, 318

(56) References Cited

U.S. PATENT DOCUMENTS

| | | | |
|---|---|---|---|
| 4,682,111 | 7/1987 | Hughes | 324/320 |
| 5,003,276 | 3/1991 | Sarwinski | 324/320 |
| 5,045,794 * | 9/1991 | Dorri | 324/320 |
| 5,047,720 | 9/1991 | Guy | 324/320 |
| 5,550,472 | 8/1996 | Richard | 324/320 |

FOREIGN PATENT DOCUMENTS

| | | |
|---|---|---|
| 42 14 128 A1 | 11/1992 | (DE) . |
| 0 272 411 | 6/1988 | (EP) . |
| 2 276 946 | 10/1994 | (GB) . |

* cited by examiner

Primary Examiner—Jay Patidar
Assistant Examiner—Brij B. Shrivastav
(74) Attorney, Agent, or Firm—Paul Vincent

(57) ABSTRACT

The magnetic field in the working volume of an apparatus for the measurement of magnetic resonance, in particular nuclear magnetic resonance, is homogenized in that shim platelets are arranged in stacks in pre-calculated positions around the working volume and for a fine adjustment in the mounted state they are continuously displaced from these positions, preferably by means of piezo translators.

16 Claims, 3 Drawing Sheets

DEVICE AND METHOD TO HOMOGENIZE A MAGNETIC FIELD

This application claims Paris convention priority of German patent application 199 01 331.4 filed Jan. 15, 1999, the complete disclosure of which is hereby incorporated by reference.

BACKGROUND OF THE INVENTION

The invention concerns a device and a method to homogenize in a working volume of a magnetic resonance apparatus the magnetic field created by its main magnet. The working volume is surrounded by a multitude of ferromagnetic platelets whose number, magnetization strengths and fixed positions are chosen such that in combination they essentially cancel field inhomogeneities of the main magnet across the working volume.

Such a device and such a method are known for example from EP 0 272 411 B1.

In contrast to magnet shimming with so-called shim coils which are fed with correction currents, recently in particular in magnets of imaging nuclear magnetic resonance (MRI) the so-called "passive shimming" has more and more become dominating where the actively controllable shim coils are replaced by passive, ferromagnetic or also by permanent magnetic small platelets being placed around the working volume at predetermined locations. In common superconductive tomography magnets with room temperature bore, rod-shaped support structures are inserted into axial guiding mechanisms at the wall of the room temperature bore. In each support structure, at predetermined positions, a pre-calculated number of ferromagnetic "shim platelets" is stacked and fixed.

Whereas for example in superconducting high resolution NMR magnets shim coil sets are still in use in order to homogenize the field at the sample location, in the field of nuclear spin tomography (MRI) in most cases the above mentioned method of passive shimming is used which requires more calculation effort but is less expensive and is on the long run more convenient since it has to be performed only once and needs later on no current or power supplies.

However, even when rather small individual shim platelets are used, the field correction is in a certain sense "digitized" since at predetermined positions only platelets with fixed magnetic moment can be added or removed. Moreover, this procedure requires access to the working volume itself or at least reconstructions in the immediate surroundings of the working volume. Therefore passive shimming can fully profit from its advantages only if the field homogenizing can really be performed once and for all, if need be in a few iteration steps. In cases where the field distribution across the working volume changes with time, e.g. already by introduction of a measuring object, by the time-dependent influence of ferromagnetic objects in the neighborhood or also by a change of the main coil field profile during operation, in particular of permanent magnets or resistive magnets with pole pieces, readjustment at a later time can be desirable.

In EP 0 823 641 A1 it is suggested to use passive shim platelets at predetermined locations as well as shim coils in order to limit on the one hand the number of required shim positions and on the other hand the required shim currents. This requires both, installation of a conventional shim system with coils and support structures for passive shims.

U.S. Pat. No. 4,682,111 discloses a pole piece magnet, each pole piece comprising a concave portion surrounded by a toroidal portion. To further improve field uniformity, a plurality of hydraulically adjustable, ferromagnetic projections extend from the surface of each pole piece. The number of these projections is fixed and they are moved by complex spring mechanisms integrated into the ferromagnetic pole pieces comprising pressurized channels through the pole piece material of the electromagnet.

There is a need for a homogenizing device and a homogenizing method of the kind mentioned initially, making use of passive shim platelets but which allow in a second step a fine adjustment of the field homogenizing by means of these platelets without requiring a re-distribution or a reconstruction of the support structure.

SUMMARY OF THE INVENTION

The object is solved by a device to homogenize in a working volume of a magnetic resonance apparatus the magnetic field created by its main magnet, the device surrounding the working volume and comprising a multitude of ferromagnetic platelets (shims) mounted in stacks of pre-determined numbers of platelets at fixed positions into one or more support structures removably attached to the main magnet wherein the fixed positions, numbers of platelets at these positions and magnetization strengths of the platelets are chosen such that in combination they essentially cancel field inhomogeneities of the main magnet across the working volume, and for an actual fine correction at least some of the shim stacks are mounted movably about their fixed positions with small amplitudes along at least one direction.

With respect to a method using such a device, the object is solved by a method to homogenize a magnetic field created by a main magnet in a working volume of a magnetic resonance apparatus, by means of a device surrounding the working volume and comprising a multitude of ferromagnetic platelets (shims) mounted in stacks of pre-determined numbers at fixed positions into one or more support structures removably attached to the main magnet wherein the fixed positions, numbers of platelets at these positions and magnetization strengths of the platelets are chosen such that in combination they essentially cancel field inhomogeneities of the main magnet across the working volume, and for an actual fine correction at least some of the shim stacks are mounted movably about their fixed positions with small amplitudes along at least one direction, the method comprising the following steps:

a) a field distribution across the working volume is measured;

b) by means of this field distribution fixed positions, numbers of shims at these positions and their magnetization strengths are calculated such that in combination they largely cancel field inhomogeneities of the main magnet across the working volume;

c) the shims are transferred to the stacks in the calculated positions and rigidly fixed with respect to the working volume in stacks in one or more removable support structures;

d) the field distribution across the working volume is measured again;

e) at least for some of the shim stacks, small displacements along at least one direction from their position as calculated in step b) are determined which further reduce the remaining field inhomogeneities determined in step d);

f) as a fine correction, at least some of the shim stacks—in their mounted state—are displaced from their positions calculated in step b) by the small amplitudes determined in step e).

The object is further achieved by a method to homogenize a magnetic field created by a main magnet in a working volume of a magnetic resonance apparatus, by means of a device surrounding the working volume and comprising a multitude of ferromagnetic platelets (shims) mounted in stacks of pre-determined numbers at fixed positions into one or more support structures removably attached to the main magnet wherein the fixed positions, numbers of platelets at these positions and magnetization strengths of the platelets are chosen such that in combination they essentially cancel field inhomogeneities of the main magnet across the working volume, and for an actual fine correction at least some of the shim stacks are mounted movably about their fixed positions with small amplitudes along at least one direction, the method comprising the following steps:

a) the field distribution across the working volume is measured;

b) by means of this field distribution numbers, magnetization strengths and fixed positions of shim stacks are calculated such that in combination they largely cancel field inhomogeneities of the main magnet across the working volume;

c) the shims are transferred to the calculated positions and rigidly fixed with respect to the working volume in stacks in one or more support structures;

d) for a fine correction and based on one or more parameters derived by a magnetic resonance measurement which depends on field inhomogeneities, at least some of the displacements along at least one direction from their fixed positions calculated in step b) are determined which further reduce the field inhomogeneities;

e) at least some of the shim stacks—in their mounted state—are displaced from their positions calculated in step b) by the small amplitudes determined in step d).

Since a coarse homogenizing step where only shim platelets at fixed positions are added or subtracted, is followed by a continuous fine adjustment of the individual introduced shim platelets by shifting stacks with small amplitudes, the compensation of field inhomogeneities inside the working volume can be more accurate and in particular it can be performed without removing and/or inserting individual platelets, components of or their entire support structure. In this way, it becomes also possible to compensate time-dependent inhomogeneities by means of the passive shim platelets.

The inhomogeneities remaining after the coarse homogenizing with platelets in fixed positions, can in a first step again be determined by measuring across the working volume and by calculation "better" positions of the platelets may be derived which lead to a more homogeneous distribution. Depending on the design, small shifts of all or of selected platelets in one, two or three directions may be admissible. In particular for permanent magnetic ones a rotation is also conceivable. Mapping of the working volume can be performed by means of field probes or also by NMR imaging methods which are per se known.

Subsequently, the platelets can in addition be shifted with even smaller amplitudes off their new "optimum" positions in order to continuously compensate time-dependent or sample-specific additional inhomogeneities. This may for example be effected by deriving from the actual sample measurement an information which allows to draw conclusions about the actual field homogeneity inside the working volume or by insertion of a short separate measuring step to this end. In an NMR measurement this could e.g. be a time-dependent NMR signal (FID, spin echo) or also the width and/or shape of an NMR line. For certain measurements, the platelets may also be controlled according to a fixed program, e.g. if during a pulse sequence with switched gradients certain field distortions are expected. In particular in resistive or permanent magnets, a control parameter may also be the temperature or temperature distribution of a pole piece. Movements of the measuring object or inside the measuring object can also be a trigger for homogeneity shifts, in particular if materials or interfaces with different magnetic susceptibilities are shifting.

The preceding step of a new mapping of the working volume and determination of new (permanent) optimum positions of the platelets may also be omitted and there is only an actual control by shifting about the formerly fixed positions according to one or more parameters either during or in between actual magnetic resonance measurements.

The shifts of the platelets are small compared to the distances between the platelet positions determined during the first step. This has the advantage that the working volume is at first shimmed by means of known calculation methods. Usually, these calculation methods compute for fixed positions a magnetic moment attached to the individual position which is approximated by several shim platelets. The solution found in this way is already at least a good approximation. Starting from there, now a better solution may either be calculated or found experimentally by variations of small amplitudes.

Preferably, the amplitudes of the shims are each smaller than ⅓ of the distance to the next shim position. This amplitude can be handled by the apparatus and is mathematically not too far off the initial solution, making the computing algorithm (and possibly manual trial and error) safer.

It is particularly advantageous to control the amplitudes from a console at a distance from the main magnet., e.g. in a neighboring room. In this way, it is not required to approach the magnet and to enter its stray field which would disturb the shim procedure. Preferably, the console is outside the so-called 5-Gauss-line.

In a particularly preferred embodiment of the shim displacement, piezo translators are used. These are non-magnetic and are controlled by in fact rather high voltages but nearly without currents. Therefore the field distribution is not noticeably disturbed. Moreover, they are very precise and reproducible. The piezo translators are attached to one or more fixed support structures and comprise on their part support structures to accept shims. In principle, commercial piezo translators may be used with amplitudes from the $\mu$m to the cm range along one, two or three axes.

However, the shims or shim stacks may be moved in other ways, e.g. via pressure in a pneumatic conduit to a pneumatic translator. This translator can on the one hand change its position essentially proportional to the pressure and allows in this way a continuous shift. On the other hand it may respond to pressure pulses causing the shim or shim stack to jump into a very close neighboring position where it remains fixed until the next pressure pulse arrives. During the movement/fixing one can take advantage of the fact that the main magnet field effects a force onto the shims/shim stacks. The amplitude is now only quasi-continuous, i.e. digitized in very fine steps.

Movements under such or similar conditions where an object is shifted by a pulse step by step are per se known in the general prior art and may be taken over or adapted to the present problem. Insofar the invention is not limited to particular embodiments. Other pulse excitements are conceivable apart from compressed air, in particular also ones that would in fact disturb the magnetic resonance measurement, since they must act only during short time intervals.

In conventional tomography systems with a tube-like room temperature access to the working volume or in conventional superconducting analytical NMR magnets but also e.g. in superconducting magnets to measure ion cyclotron resonance (ICR), the calculated shim positions can essentially be arranged on a cylinder surface and/or the shim support structure, too, comprises essentially a circular cylindrical symmetry. This is adapted to the geometry. In pole piece magnets, e.g. some ESR magnets or so-called "open" tomography magnets the shims will essentially be arranged in a plane parallel to the plane of the pole piece. This holds in particular also for one-sided magnet designs where the working volume is located outside the actual magnet structure.

Preferably, the shims are ferromagnetic platelets which can be stacked in the calculated or pre-determined positions. Generally, largely identical shim platelets will be used and the total magnetic moment at a shim position will be determined by stacking more or fewer platelets. In special cases, a few, e.g. up to three or five, different kinds of shims may be used, the different kinds comprising different magnetic moments. It is also possible to employ soft magnetic shims in some positions and permanent magnetic ones in other positions, in particular where magnetic moments antiparallel to the main field are advantageous. These variants and any combinations thereof may improve the flexibility of the design and may be better adapted to special conditions.

Quite generally, the shim positions have to and will take into account the geometry of the main magnet and of the required free accesses to the working volume.

It is understood that the features described above and the ones to be mentioned below may be used not only in the respective combination but also in other combinations or on their own without leaving the frame of the present invention.

The devices and methods, respectively, according to the invention may be combined with per se known shim devices and methods, respectively, and/or may be integrated into these. In particular, additional conventional shim coils may be present. It is not mandatory that all shims of a device according to the invention can be shifted in a controlled way as described.

In the following, the invention is described in more detail with reference to the figures. It is shown in:

DESCRIPTION OF THE PREFERRED EMBODIMENTS

Figure 1:
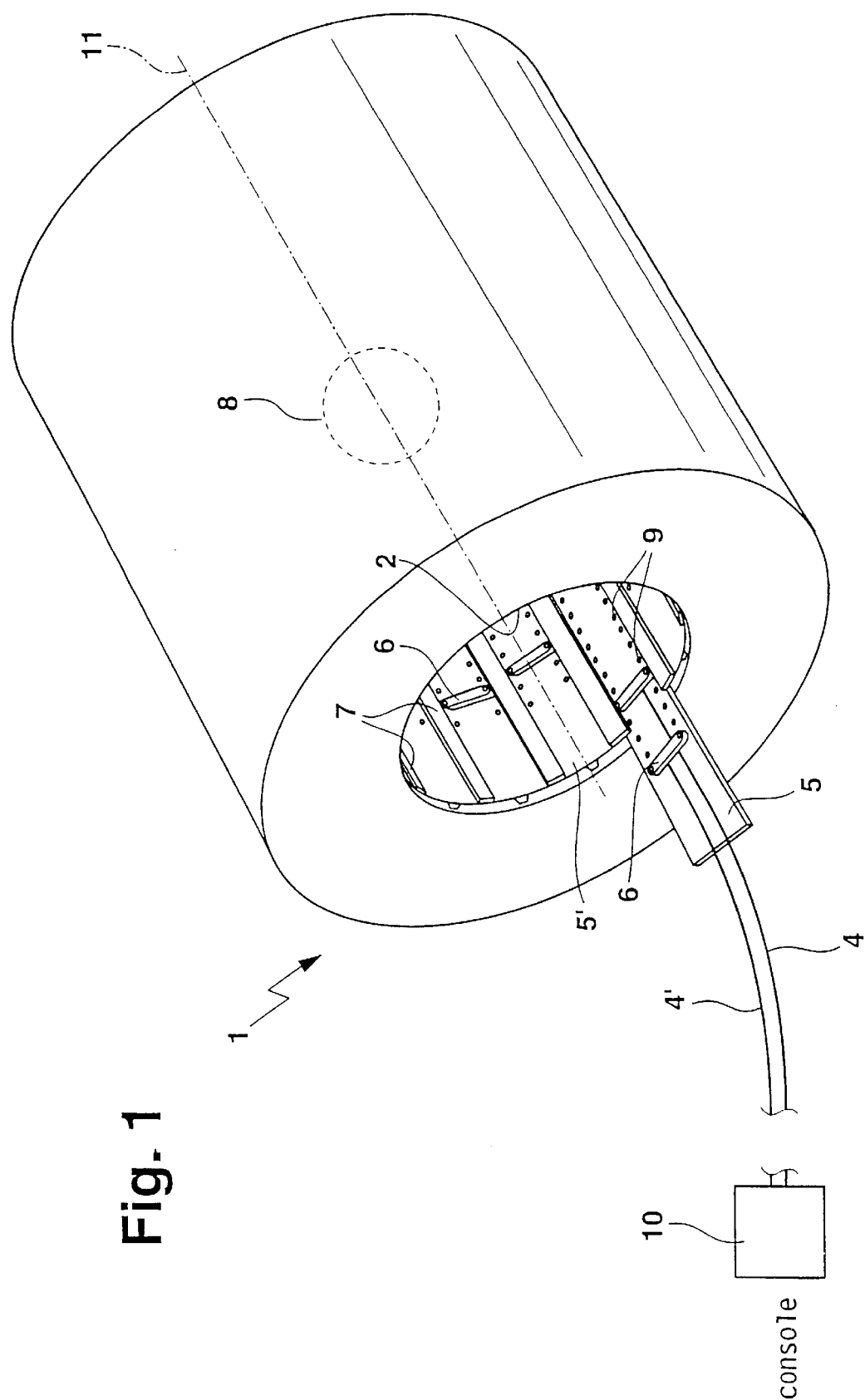
FIG. 1: extremely schematically the main magnet of a nuclear resonance apparatus with a first embodiment of a homogenizing device according to the invention.

FIG. 1 shows extremely schematically a conventional superconducting main magnet 1 of a nuclear spin tomograph with an axial 11 room temperature bore 2. The working volume 8 is located in the central region of the room temperature bore 2 and is visible in FIG. 1 only through uncovering. At the inner wall of the room temperature bore 2 there are axial guides 7 into which support structures 5 can be inserted with possible positions 9 where shim platelets 6 may be stacked. The support structures 5 are inserted into the guides 7 and fixed. A common cylinder symmetrical support structure is also conceivable.

According to the invention, the shim platelet stacks are each mounted to a piezo translator which can shift them radially with respect to axis 11. The piezo translators are connected to a console 10 via leads 4. Thereby defined high voltages may be applied to each translator and the radial shift of the shim platelet stacks can thus be adjusted from the distant console. Usually, the console will be located in a separate antechamber of the examination room where the main magnet is located.

Instead of—or in combination with—the radial shift, the translators may also be suited to shift the shim platelet stacks along axis 11 or in an azimuth direction about axis 11. The respective shift amplitude is small, generally smaller, preferably very much smaller, than the corresponding extension of the shim platelet stacks 6 in the respective direction.

Figure 2:
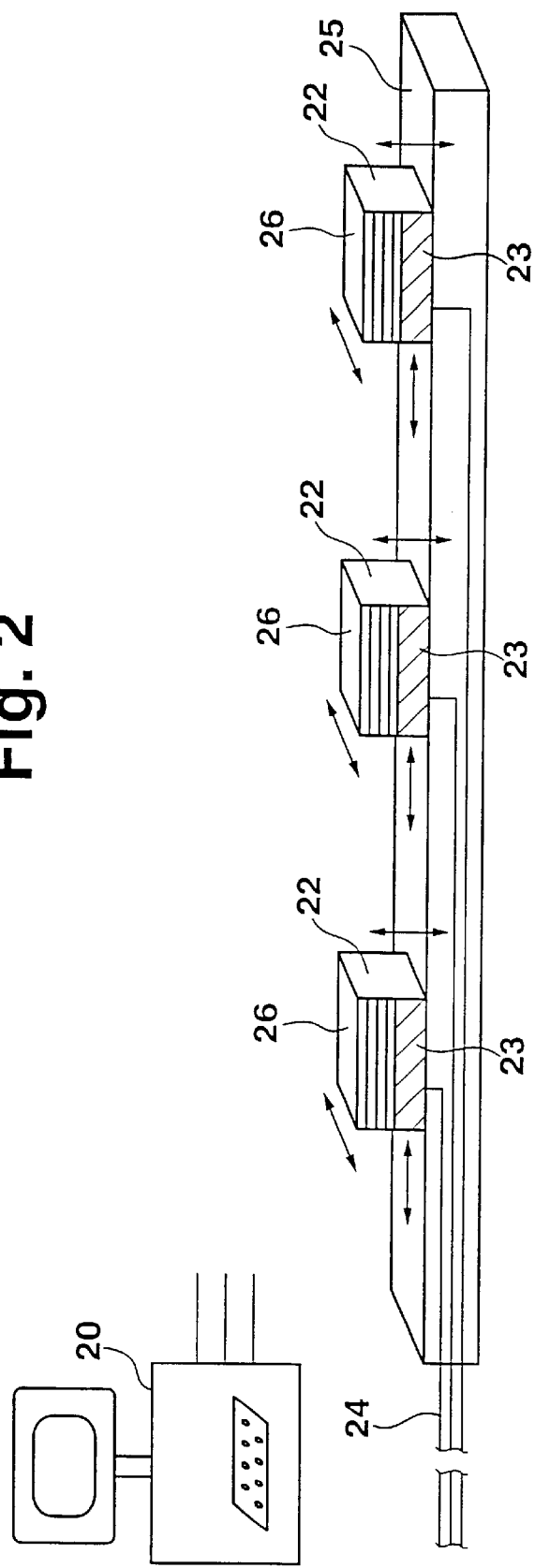
FIG. 2: extremely schematically a detailed view of piezo translators attached to a support plate, e.g. of the first embodiment of the invention according to FIG. 1.

The arrangement of part of the shim platelet stacks 26 is depicted in more detail, but still schematically, in FIG. 2. On a support plate 25 are mounted piezo translators 23 which each allow for a shift, e.g. perpendicular to the support plate 25. Each piezo translator 23 carries in a support structure 22 a stack 26 of identical ferromagnetic shim platelets, which are magnetised by the main magnetic field. Application of a high voltage via leads 24 causes the translator 26 to expand or to contract again and to thereby shift the platelet stack in a defined way. The support plate 25 may be part of a support tube (see FIG. 1) but also one of two essentially planar shim plates of a pole piece magnet. In one-sided main magnets—which provide a largely free access within a half-space about the working volume—only one shim plate may be employed. Depending on the main magnet design, quite generally, the shim platelets will be placed in positions around the working volume which do not obstruct a desired free access or only to a lesser degree. Therefore, also configurations are conceivable where the shims are not arranged in planes or on cylinders but—in particular with main magnets with a complicated design—in positions where their disturbing influence is small.

Figure 3:
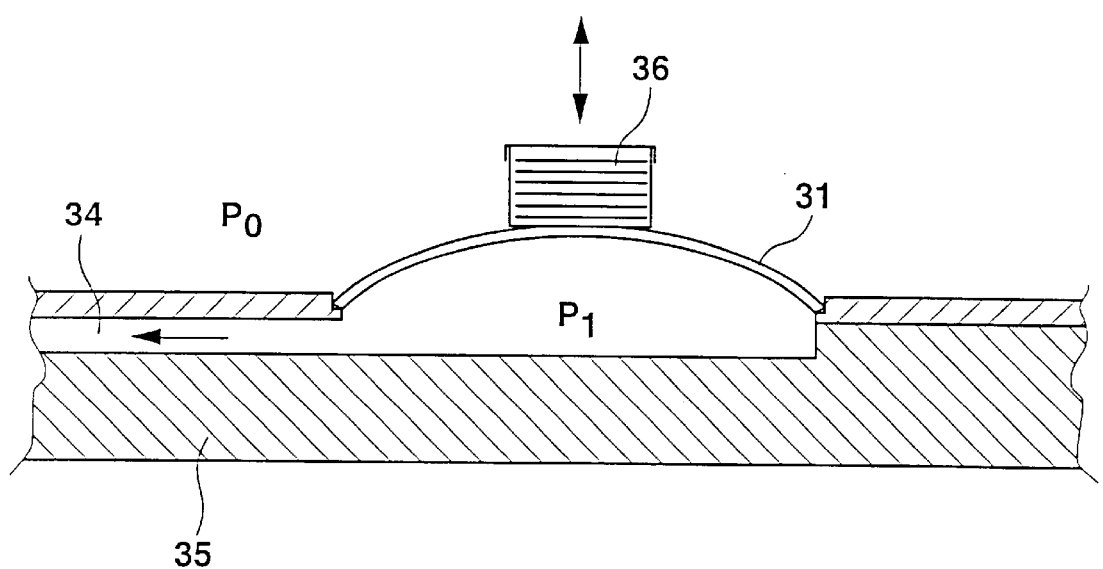
FIG. 3: a pneumatic translator of a further embodiment of a homogenizing device according to the invention.

FIG. 3 shows a configuration where shim platelets 36 are shifted 31 pneumatically (or hydraulically) against the force of a spring by means of a pressure $p_1$ which can be controlled from the console via a conduit 34. The spring 31 can be non-magnetic but also ferromagnetic and its pressure-dependent influence may be accounted for during the compensation. The shape of the spring can be varied, in particular the magnetic force exerted by the main magnetic field onto the shim platelets 36 may—inter alia—be used as a pull-back force. It is understood that FIG. 3 shows explicitly only one of many possible embodiments of a pneumatic displacement of the shim platelets. To the expert many variations will be apparent that fall within the scope of the invention.

Within the frame of the invention are also embodiments where the shim platelets are successively moved by a pulse—in particular a pressure pulse—from one discrete position to a next one which is close by (e.g. saw-tooth-like anchor points). With this kind of displacement, again the main magnetic field may be used for the arrest force in the respective fixed position. Preferably, the displacement is periodical as a function of successive pulses, e.g. after a maximum displacement is reached the shift direction is reversed or the shim platelets jump back into their initial position.

What is claimed is:

1. Device to homogenize a magnetic field created in a working volume by a main magnet of a magnetic resonance apparatus, the device essentially surrounding the working volume and comprising a multitude of ferromagnetic platelets (shims) mounted in stacks of predetermined numbers at fixed positions into one or more support structures removably attached to the main magnet wherein the fixed positions, numbers of platelets at these positions and magnetization strength of the platelets are chosen such that in combination they essentially cancel field inhomogenities of the main magnet across the working volume, and further comprising means, to which at least some of the shim stacks are mounted, for moving said at least some shim stacks about their fixed positions with small amplitudes along at least one direction for an actual fine correction, wherein the means for moving comprised piezo translators that are mounted to the support structures and that carry the shim stacks.

2. Device according to claim 1, wherein the calculated positions of the shim stacks are arranged essentially on a cylinder surface.

3. Device according to claim 1, wherein said ferromagnetic platelets comprise a first platelet group having a first magnetic moment and a second platelet group having a second magnetic moment different from said first magnetic moment.

4. Device according to claim 2, wherein said platelets comprise a first platelet group having a first magnetic moment and a second platelet group having a second magnetic moment different from said first magnetic moment.

5. Method to homogenize a magnetic field created by a main magnet in a working volume of a magnetic resonance apparatus, by means of a device essentially surrounding the working volume and comprising a multitude of ferromagnetic platelets (shims) mounted in stacks of predetermined numbers at fixed positions into one or more support structures removably attached to the main magnet wherein the fixed positions, numbers of platelets at these positions and magnetization strengths of the platelets are chosen such that in combination they essentially cancel field inhomogeneities of the main magnet across the working volume, and for an actual fine correction at least some of the shim stacks are mounted movably about their fixed positions with small amplitudes along at least one direction, the method comprising the following steps:
   a) a field distribution across the working volume is measured;
   b) by means of this field distribution fixed positions, numbers of shims at these positions and their magnetization strengths are calculated such that in combination they largely cancel field inhomogeneities of the main magnet across the working volume;
   c) the shims are transferred to the stacks in the calculated positions and rigidly fixed with respect to the working volume in stacks in one or more removable support structures;
   d) the field distribution across the working volume is measured again;
   e) at least for some of the shim stacks, small displacements along at least one direction from their position as calculated in step b) are determined which further reduce the remaining field inhomogeneities determined in step d);
   f) as a fine correction, at least some of the shim stacks—in their mounted state—are displaced from their fixed positions calculated in step b) by the small amplitudes determined in step e).

6. Method according to claim 5, wherein during or between an actual magnetic resonance measurements of an object in the working volume, the following additional step is added:
   g) based on one or more parameters derived by a magnetic resonance measurement which depends on field inhomogeneities, at least some of the displacements calculated in step e) are further optimized for an even finer correction.

7. Method according to claim 6, wherein the displacements are controlled via electric voltages applied to piezo translators which shift the shim stacks.

8. Method according to claim 7, wherein during an actual magnetic resonance measurement the displacements of one or more shim stacks from their calculated positions are shifted on-line in order to compensate on-line disturbances of the homogeneity caused by the measurement itself.

9. Method according to claim 6, wherein during an actual magnetic resonance measurement the displacements of one or more shim stacks from their calculated positions are shifted on-line in order to compensate on-line disturbances of the homogeneity caused by the measurement itself.

10. Method according to claim 5, wherein the displacements are controlled via electric voltages applied to piezo translators which shift the shim stacks.

11. Method according to claim 10, wherein during an actual magnetic resonance measurement the displacements of one or more shim stacks from their calculated positions are shifted on-line in order to compensate on-line disturbances of the homogeneity caused by the measurement itself.

12. Method according to claim 5, wherein during an actual magnetic resonance measurement the displacements of one or more shim stacks from their calculated positions are shifted on-line in order to compensate on-line disturbances of the homogeneity caused by the measurement itself.

13. Method to homogenize a magnetic field created by a main magnet in a working volume of a magnetic resonance apparatus, by means of a device essentially surrounding the working volume and comprising a multitude of ferromagnetic platelets (shims) mounted in stacks of predetermined numbers at fixed positions into one or more support structures removably attached to the main magnet wherein the fixed positions, numbers of platelets at these positions and magnetization strengths of the platelets are chosen such that in combination they essentially cancel field inhomogeneities of the main magnet across the working volume, and for an actual fine correction at least some of the shim stacks are mounted movably about their fixed positions with small amplitudes along at least one direction, the method comprising the following steps:
   d) the field distribution across the working volume is measured;
   e) by means of this field distribution numbers, magnetization strengths and fixed positions of shim stacks are calculated such that in combination they largely cancel field inhomogeneities of the main magnet across the working volume;
   f) the shims are transferred to the calculated positions and rigidly fixed with respect to the working volume in stacks in one or more support structures;
   d) for a fine correction and based on one or more parameters derived by a magnetic resonance measurement which depends on field inhomogeneities, at least some of the displacements along at least one direction from their fixed positions calculated in step b) are determined which further reduce the field inhomogeneities;

e) at least some of the shim stacks—in their mounted state—are displaced from their positions calculated in step b) by the small amplitudes determined in step d).

14. Method according to claim 13, wherein the displacements are controlled via electric voltages applied to piezo translators which shift the shim stacks.

15. Method according to claim 14, wherein during an actual magnetic resonance measurement the displacements of one or more shim stacks from their calculated positions are shifted on-line in order to compensate on-line disturbances of the homogeneity caused by the measurement itself.

16. Method according to claim 13, wherein during an actual magnetic resonance measurement the displacements of one or more shim stacks from their calculated positions are shifted on-line in order to compensate on-line disturbances of the homogeneity caused by the measurement itself.

* * * * *